United States Patent
Song et al.

(10) Patent No.: US 10,942,232 B2
(45) Date of Patent: Mar. 9, 2021

(54) RF COIL ARRAY AND MRI TRANSMIT ARRAY

(71) Applicant: GE Precision Healthcare LLC, Wauwatosa, WI (US)

(72) Inventors: Tingting Song, Shanghai (CN); Desmond Teck Beng Yeo, Niskayuna, NY (US); Thomas Kwok-Fah Foo, Niskayuna, NY (US); Xin Jiang, Shanghai (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 76 days.

(21) Appl. No.: 15/924,579

(22) Filed: Mar. 19, 2018

(65) Prior Publication Data

US 2018/0275227 A1    Sep. 27, 2018

(30) Foreign Application Priority Data

Mar. 23, 2017  (CN) .......................... 201710177525.6

(51) Int. Cl.
*G01R 33/36* (2006.01)
*G01R 33/565* (2006.01)
(Continued)

(52) U.S. Cl.
CPC ..... *G01R 33/3614* (2013.01); *G01R 33/3415* (2013.01); *G01R 33/5659* (2013.01); *G01R 33/422* (2013.01)

(58) Field of Classification Search
CPC ............ G01R 33/3614; G01R 33/3415; G01R 33/5659; G01R 33/422
(Continued)

(56) References Cited

U.S. PATENT DOCUMENTS

| 4,638,253 A | * | 1/1987 | Jaskolski | ........... G01R 33/3628 324/311 |
| 4,763,076 A | * | 8/1988 | Arakawa | ............ G01R 33/3628 324/318 |

(Continued)

FOREIGN PATENT DOCUMENTS

| CN | 1279366 C | 10/2006 |
| CN | 101675353 B | 8/2013 |

(Continued)

OTHER PUBLICATIONS

Asfour, Aktham, Design and development of a new dedicated RF sensor for the MRI of rat brain. J. Biomedical Science and Engineering, 2010, 3, 167-180 (Year: 2010).*

(Continued)

*Primary Examiner* — Patrick Assouad
*Assistant Examiner* — Sean Curtis
(74) *Attorney, Agent, or Firm* — Armstrong Teasdale LLP

(57) ABSTRACT

An RF coil array for use in MRI is disclosed, which includes a plurality of transmit coil elements and a plurality of RF power amplifiers. Each RF power amplifier is integrated with at least one transmit coil element for driving the at least one transmit coil element. An MRI transmit array is also disclosed, which includes a plurality of RF transmitters for generating a plurality of RF signals, the RF coil array above-mentioned, and a DC voltage source for providing a DC voltage to the plurality of transmit coil elements. The RF coil array further includes an RF shield for shielding the plurality of transmit coil elements from interacting with magnet cryostat and gradient coil elements. The plurality of RF power amplifiers are connected with respective RF transmitters and configured for power amplification of the RF signals from the respective RF transmitters, and the (Continued)

plurality of transmit coil elements are configured for transmitting respective amplified RF signals.

19 Claims, 7 Drawing Sheets

(51) Int. Cl.
  *G01R 33/3415* (2006.01)
  *G01R 33/422* (2006.01)
(58) Field of Classification Search
  USPC .................................................. 324/300–322
  See application file for complete search history.

(56) References Cited

U.S. PATENT DOCUMENTS

| | | | |
|---|---|---|---|
| 4,952,878 A | 8/1990 | Mens et al. | |
| 5,041,790 A | 8/1991 | Tropp et al. | |
| 5,559,434 A | 9/1996 | Takahashi et al. | |
| 5,777,474 A * | 7/1998 | Srinivasan | G01R 33/34046 324/318 |
| 6,326,788 B1 * | 12/2001 | Mulder | G01R 33/4215 324/309 |
| 6,411,090 B1 | 6/2002 | Boskamp | |
| 6,587,708 B2 * | 7/2003 | Venkatesan | G01R 33/5613 324/306 |
| 6,828,790 B2 | 12/2004 | Katscher et al. | |
| 6,900,636 B2 | 5/2005 | Leussler | |
| 6,906,518 B2 | 6/2005 | Leussler | |
| 6,943,551 B2 * | 9/2005 | Eberler | G01R 33/34046 324/318 |
| 6,982,554 B2 * | 1/2006 | Kurpad | G01R 33/34046 324/318 |
| 7,279,901 B2 | 10/2007 | Diehl et al. | |
| 7,382,128 B2 | 6/2008 | Bulkes | |
| 7,411,398 B2 | 8/2008 | Kuth et al. | |
| 7,525,313 B2 * | 4/2009 | Boskamp | G01R 33/3415 324/309 |
| 7,615,999 B2 | 11/2009 | Graesslin et al. | |
| 7,616,000 B2 * | 11/2009 | Chu | G01R 33/3614 324/318 |
| 7,671,595 B2 | 3/2010 | Griswold et al. | |
| 7,692,427 B2 | 4/2010 | Lee et al. | |
| 7,701,213 B2 | 4/2010 | Graesslin et al. | |
| 7,800,368 B2 * | 9/2010 | Vaughan | G01R 33/546 324/318 |
| 8,035,384 B2 * | 10/2011 | Saha | G01R 33/34046 324/318 |
| 8,099,059 B2 | 1/2012 | Graesslin et al. | |
| 8,159,223 B2 | 4/2012 | Luekeke et al. | |
| 8,169,221 B2 * | 5/2012 | Griswold | G01R 33/3635 324/322 |
| 8,269,498 B2 * | 9/2012 | Zhang | G01R 33/3415 324/318 |
| 8,294,464 B2 | 10/2012 | Gudino et al. | |
| 8,390,288 B2 | 3/2013 | Graesslin et al. | |
| 8,406,853 B2 * | 3/2013 | Petropoulos | G01R 33/58 600/417 |
| 8,427,158 B2 | 4/2013 | Huish et al. | |
| 8,502,535 B2 | 8/2013 | Jurrissen et al. | |
| 8,604,791 B2 * | 12/2013 | Vaughan, Jr. | G01R 33/3415 324/318 |
| 9,024,636 B2 | 5/2015 | Kozlov et al. | |
| 9,024,637 B2 | 5/2015 | Peter et al. | |
| 9,097,769 B2 * | 8/2015 | Schillak | G01R 33/54 |
| 9,977,101 B2 * | 5/2018 | Lemaire | G01R 33/3415 |
| RE47,026 E * | 9/2018 | Vaughan | G01R 33/543 |
| 10,148,231 B2 * | 12/2018 | Hussein | G01R 33/3614 |
| 10,156,621 B2 * | 12/2018 | Zhai | G01R 33/543 |
| 10,222,434 B2 * | 3/2019 | Poole | A61B 6/4405 |
| 10,539,637 B2 * | 1/2020 | Poole | G01R 33/383 |
| 10,627,463 B2 * | 4/2020 | Schillak | G01R 33/54 |
| 10,775,454 B2 * | 9/2020 | Poole | G01R 33/3852 |
| 2005/0242816 A1 * | 11/2005 | Kurpad | G01R 33/34046 324/322 |
| 2007/0016003 A1 * | 1/2007 | Piron | A61B 90/11 600/415 |
| 2008/0272787 A1 * | 11/2008 | Boskamp | G01R 33/3453 324/322 |
| 2010/0102817 A1 * | 4/2010 | Saha | G01R 33/34046 324/318 |
| 2010/0136929 A1 * | 6/2010 | Vernickel | G01R 33/34076 455/91 |
| 2010/0141257 A1 | 6/2010 | Graesslin et al. | |
| 2010/0141259 A1 | 6/2010 | Graesslin et al. | |
| 2011/0254551 A1 * | 10/2011 | Leussler | G01R 33/3614 324/318 |
| 2012/0062230 A1 * | 3/2012 | Vaughan, Jr. | G01R 33/3614 324/318 |
| 2012/0123245 A1 * | 5/2012 | Petropoulos | G01R 33/3415 600/417 |
| 2012/0223709 A1 * | 9/2012 | Schillak | G01R 33/3621 324/309 |
| 2013/0069652 A1 * | 3/2013 | Otake | G01R 33/3664 324/322 |
| 2013/0134975 A1 | 5/2013 | Nehrke et al. | |
| 2013/0300418 A1 | 11/2013 | Eberler et al. | |
| 2014/0097846 A1 * | 4/2014 | Lemaire | G01R 33/3415 324/322 |
| 2014/0139218 A1 * | 5/2014 | Findeklee | H04B 1/0458 324/318 |
| 2014/0210472 A1 | 7/2014 | Homann et al. | |
| 2014/0254514 A1 | 9/2014 | Mobasher et al. | |
| 2014/0307764 A1 | 10/2014 | Adolf et al. | |
| 2015/0025362 A1 | 1/2015 | Biber et al. | |
| 2015/0268321 A1 * | 9/2015 | Zhai | G01R 33/583 324/309 |
| 2015/0338478 A1 * | 11/2015 | Schillak | G01R 33/3607 324/309 |
| 2017/0359034 A1 * | 12/2017 | Hussein | H03F 3/245 |
| 2018/0081008 A1 * | 3/2018 | Yang | G01R 33/34046 |
| 2018/0143274 A1 * | 5/2018 | Poole | G01R 33/34092 |
| 2018/0156881 A1 * | 6/2018 | Poole | G01R 33/389 |
| 2018/0164390 A1 * | 6/2018 | Poole | G01R 33/48 |
| 2018/0168527 A1 * | 6/2018 | Poole | A61B 50/13 |
| 2018/0210047 A1 * | 7/2018 | Poole | A61B 90/00 |
| 2018/0224512 A1 * | 8/2018 | Poole | G01R 33/5659 |
| 2018/0238978 A1 * | 8/2018 | McNulty | G01R 33/3806 |
| 2018/0238980 A1 * | 8/2018 | Poole | G01R 33/383 |
| 2018/0238981 A1 * | 8/2018 | Poole | G01R 33/48 |
| 2018/0275227 A1 * | 9/2018 | Song | G01R 33/3415 |
| 2019/0004130 A1 * | 1/2019 | Poole | A61B 5/0555 |
| 2019/0011513 A1 * | 1/2019 | Poole | G01R 33/34092 |
| 2019/0011514 A1 * | 1/2019 | Poole | G01R 33/5608 |
| 2019/0018096 A1 * | 1/2019 | Poole | G01R 33/383 |
| 2019/0250227 A1 * | 8/2019 | McNulty | G01R 33/365 |
| 2019/0250228 A1 * | 8/2019 | McNulty | G01R 33/365 |
| 2020/0088817 A1 * | 3/2020 | Poole | G01R 33/3806 |
| 2020/0341085 A1 * | 10/2020 | Poole | G01R 33/5659 |

FOREIGN PATENT DOCUMENTS

| | | | | |
|---|---|---|---|---|
| CN | 104422913 A | | 3/2015 | |
| DE | 102018106515 A1 * | | 9/2018 | G01R 33/3415 |
| IN | 200705470 P4 | | 3/2008 | |
| IN | 200907029 P4 | | 6/2010 | |
| IN | 201102479 P4 | | 3/2012 | |
| IN | 201303348 P4 | | 8/2014 | |
| IN | 201400252 P4 | | 3/2015 | |
| WO | 2015091544 A2 | | 6/2015 | |

OTHER PUBLICATIONS

Fujita et al., RF Surface Receive Array Coils: The Art of an LC Circuit. Journal of Magnetic Resonance Imaging 38:12-25 (2013) (Year: 2013).*

Gruber et al., RF Coils: A Practical Guide for Nonphysicists. J. Magn. Reson. Imaging 2018;48:590-604. (Year: 2018).*

(56) References Cited

OTHER PUBLICATIONS

Buikman et al., "The RF coil as a sensitive motion detector for magnetic resonance imaging", Magnetic Resonance Imaging vol. 6, Issue 3, May-Jun. 1988, 9 pages.
Sung-Min Sohn Sohn et al., "RF Head Coil Design With Improved RF Magnetic Near-Fields Uniformity for Magnetic Resonance Imaging (MRI) Systems," IEEE Transactions on Microwave Theory and Techniques vol. 62, Issue 8, Apr. 22, 2012, 6 pages.
Anonymous, "Optimized Magnetic Resonance Imaging Radiofrequency Coil for Integration With In-Bore Therapy or Biopsy System", IP.com, https://priorart.ip.com/IPCOM/000243104, Sep. 15, 2015, 8 pages.

* cited by examiner

RF COIL ARRAY AND MRI TRANSMIT ARRAY

CROSS REFERENCE

This application claims priority to China Patent Application Serial No. 201710177525.6 filed Mar. 23, 2017, which is incorporated herein by reference in its entirety.

BACKGROUND

This invention relates generally to the field of magnetic resonance imaging (MRI), and more particularly to a radio frequency (RF) coil array for use in the MRI and an MRI transmit array having the RF coil array.

MRI methods which utilize the interaction between magnetic fields and nuclear spin in order to form two-dimensional (2D) or three-dimensional (3D) images are widely used, notably in the field of medical diagnostics, due to the superior soft tissue image contrast, and a wide range of ability to visualize different physiologic characteristics that are superior to other imaging methods in many respects, in addition to not requiring ionizing radiation and is primarily non-invasive.

Generally, in an MRI system, an examination object, usually a patient or human tissue, is subjected to a strong, uniform main magnetic field (polarizing field, $B_0$), the individual magnetic moments of the spins in the tissue attempt to align with this polarizing field, but precess about it in random order at their characteristic Larmor frequency. If the substance, or tissue, is subjected to a time-varying magnetic field (excitation field, $B_1$) which is applied along a direction in the x-y plane, and which is at or near the Larmor precessional frequency, the net aligned moment, or "longitudinal magnetization", $M_z$, may be rotated, or "tipped", into the x-y plane to produce a net transverse magnetic moment $M_{xy}$. A signal is emitted by the excited spins after the excitation signal ($B_1$-field) is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

The flip angle during the application of the time-varying field (excitation field $B_1$) is the angle of the net aligned moment, or "longitudinal magnetization", $M_z$, that is rotated, or "tipped", into the x-y plane to produce a net transverse magnetic moment $M_{xy}$ such that the resultant transverse magnetization is a function of the flip angle, $\theta$, $$M_{xy}=M_z \sin \theta \tag{1}$$

The magnitude of the flip angle is dependent on the strength and the duration of an applied RF excitation pulse. In the case of a so-called 90° pulse, the spins are deflected from the z-axis to a transverse plane (flip angle 90°).

In MRI, the time-varying applied RF excitation field has a specific circular polarization and is referred to as the $B_1^+$-field. Similarly, the RF coil that is used to detect signals from the precessing transverse magnetization generates a $B_1$-field that is referred to as the $B_1^-$-field due to it having an opposite circular polarization to the excitation field. For the purposes of simplification in this application, as we are referring to the MR excitation process, references to the $B_1$-field implicitly means the excitation $B_1^+$-field.

It is well known that an RF coil can both affect RF excitation as well as detect the signals from precessing transverse magnetization (signal reception). The component of the $B_1$-field of the RF coil that is used to affect RF excitation is the $B_1^+$-field component, while the component of the RF coil used for detecting signals from precessing transverse magnetization is the $B_1^-$-field component.

From the MR principle above, spatial uniformity of the time-varying $B_1$-field in the examination object is very important for imaging quality. In a high field system, distribution of the $B_1$-field is distorted by the examination object's dielectric and conductive properties, as determined by Maxwell's equations. With reference to a conventional RF coil, e.g. a multi-element birdcage coil, in which distribution of the $B_1$-field is determined by the application of uniform current through all elements or rungs of the birdcage coil such that the resulting $B_1$-field is of the form $$B_1(x,y,z)=A_x \Sigma_{i=1}^{n} e^{j\phi_i} b_i(x,y,z) \tag{2}$$

where $A_x$ is a uniform current applied to all the rungs of the birdcage coil, n is the number of the rungs of the birdcage coil, $\phi_i$ is the relative phase of the $i^{th}$ rung to the adjacent rungs, and $b_i(x, y, z)$ is the $B_1$-field generated by the $i^{th}$ rung. Equation (2) describes a single channel excitation. In a conventional birdcage coil, the relative phase relationship between the rungs is, $$\phi_i = (i-1)\left(\frac{2\pi}{n}\right).$$

For two-channel excitation, the resulting $B_1$-field can be described as $$B_1(x, y, z) = A_x \sum_{i=1}^{n} e^{j\phi_i} b_i(x, y, z) + A_y \sum_{i=1}^{n} e^{j(\phi_i+\frac{\pi}{2})} b_i(x, y, z) \tag{3}$$

where $A_x$ and $A_y$ is the different current amplitude or weighting of the orthogonal excitation modes of the birdcage RF coil.

As it can be seen in Equation (3), the $B_1$-field is manipulated by only two sources with very limited flexibility. Such a conventional two-channel coil cannot provide a high degree of flexibility in manipulating the $B_1$-field. So, at high $B_0$ field strengths, it would be very desirable to have increased number of RF transmit coil channels that drive an array of multiple transmit elements, with each RF transmit coil element or channel driven with an independent amplitude ($A_i$) and phase, ($\phi_i$).

In addition, with increased number of transmit coil elements or channels in a conventional multi-channel RF transmit coil, there may be strong coupling or interactions between the transmit coil elements from mutual inductance. This coupling may result in detuning of resonant coils, which affects the coil gain, and hence the amplitude and phase of the RF pulse applied to the RF coil element (and the $B_1$-field produced by the coil element). Hence, increasing the number of coil elements or channels requires a more complicated iterative process to tune all the coil elements to a correct resonant frequency. The complexity of coil tuning increases dramatically with the increase of the number of coil elements or channels.

Furthermore, because the conventional RF coil is connected to an RF power amplifier with typically a 50-Ohm output impedance, the impedance of the RF coil needs to be matched to the output impedance of the RF power amplifier. As the RF power amplifier and the RF coil are connected, the impedance needs to be matched to 50-Ohms via a matching circuit. As the output impedance of the RF power amplifier is already matched to 50-Ohms, the RF coil also needs to match to 50-Ohms using a matching circuit. The complexity of this structure will increase dramatically with the increase of the number of coils, as variations of mutual inductance in RF coil will affect the coil impedance and the impedance matching circuit.

Therefore, it would be desirable to provide improvements on the RF coil and MRI transmit array to solve at least one of problems above-mentioned.

BRIEF DESCRIPTION

In one embodiment of the present invention, an RF coil array for use in MRI is provided. The RF coil array comprises a plurality of transmit coil elements and a plurality of RF power amplifiers. Each RF power amplifier is integrated with at least one transmit coil element for driving the at least one transmit coil element.

In another embodiment of the present invention, an MRI transmit array is provided. The MRI transmit array comprises a plurality of RF transmitters for generating a plurality of RF signals, the above-mentioned RF coil array, and a DC voltage source for providing a DC voltage to the plurality of transmit coil elements. The RF coil array further comprises an RF shield for shielding the plurality of transmit coil elements from interacting with magnet cryostat and gradient coil elements. The plurality of RF power amplifiers are connected with respective RF transmitters and configured for power amplification of the RF signals from the respective RF transmitters. The plurality of transmit coil elements are configured for transmitting respective amplified RF signals so as to provide a multi-channel parallel transmit.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments of the present invention will be described herein below with reference to the accompanying drawings. In the following description, well-known functions or constructions are not described in detail to avoid obscuring the invention in unnecessary detail.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean either or all of the listed items. The use of "including," "comprising" or "having" and variations thereof herein are meant to encompass the items listed thereafter and equivalents thereof as well as additional items.

Figure 2:
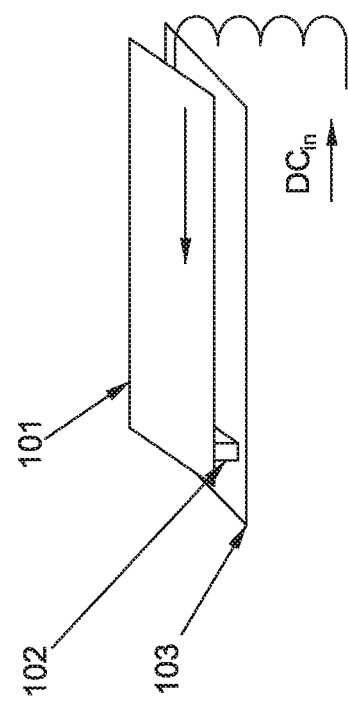
FIG. 2 is an enlarged view of a circle portion in FIG. 1.
Figure 1:
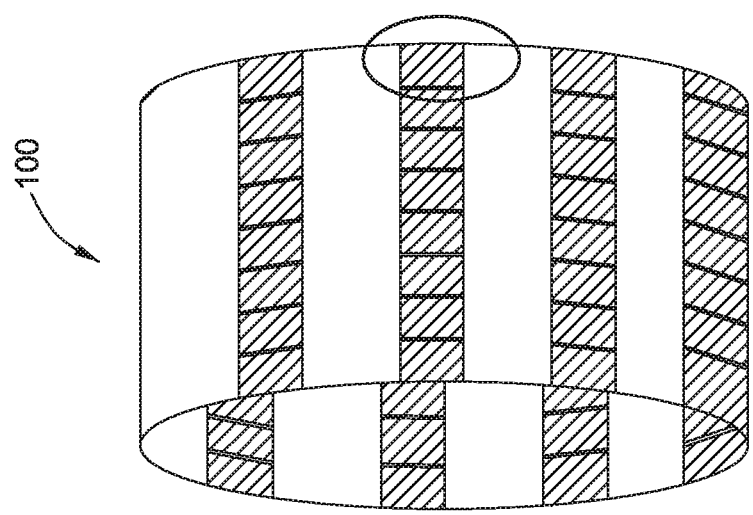
FIG. 1 is a schematic diagram of an RF coil array in accordance with an embodiment of the present invention.

FIGS. 1 and 2 illustrate a schematic diagram of an RF coil array 100 in accordance with an embodiment of the present invention. As shown in FIGS. 1 and 2, the RF coil array 100 in accordance with the embodiment of the present invention may be used in MRI and may include a plurality of transmit coil elements (or channels) 101 and a plurality of RF power amplifiers 102. Each RF power amplifier 102 may be integrated with at least one transmit coil element 101 for driving the at least one transmit coil element 101.

Each transmit coil element 101 may be a section of radiation conductor or a small coil. Each RF power amplifier 102 may be mounted directly on one section of radiation conductor or on one small coil. Or, each RF power amplifier 102 may be directly connected to one section of radiation conductor or one small coil without cables.

As an example, each RF power amplifier 102 may include a metal-oxide-semiconductor field effect transistor (MOSFET) 102. However, the RF power amplifier 102 of the present invention should be not limited to the MOSFET, and may also include other types of power amplifiers. Referring to FIG. 2, each MOSFET 102 may be a packaged discrete MOSFET, or a semiconductor MOSFET die which is directly attached to one transmit coil element 101.

The RF coil array 100 may further include an RF shield 103 for shielding the plurality of transmit coil elements 101 from interacting with magnet cryostat (not shown) and gradient coil elements (not shown). The plurality of transmit coil elements 101 integrated with respective RF power amplifiers 102 may be mounted onto the RF shield 103.

In the RF coil array 100 of the present invention, the plurality of transmit coil elements 101 are independently controlled, and each transmit coil element 101 may be driven and controlled by one integrated active RF power amplifier 102. Thus, each transmit coil element 101 itself in the RF coil array 100 of the present invention may be non-resonant. Therefore, the RF coil array 100 of the present invention may be an active coil rather than a passive resonant component.

In addition, in the RF coil array 100 of the present invention, each of the plurality of transmit coil elements 101 may have the behavior of voltage source. Thus, the excitation field ($B_1$ field) generated by each transmit coil element 101 may be maintained at a constant and well controlled level and may be independent of coil loading (i.e., coil coupling). However, the behavior of each transmit coil element 101 of the present invention is not limited to the voltage source. In another embodiment, each transmit coil element 101 of the present invention may also have the behavior of current source.

Because the RF coil array 100 of the present invention is the active coil, complicated coil retuning is not required for the RF coil array 100 of the present invention. There is no need to trade off coil efficiency from the tuning process or to implement coil overlaps to reduce mutual inductance. Hence, for the RF coil array 100 of the present invention, the total RF power requirements can be reduced dramatically.

Furthermore, because the RF power amplifiers 102 are integrated with respective transmit coil elements 101, the RF power generation can be integrated into the RF coil array 100, which may facilitate a simpler system design and efficient use of space. In contrast to conventional passive coils, the RF power amplifiers 102 and the transmit coil elements 101 of the present invention do not necessarily require matching circuits and the RF coil array 100 of the present invention may save cables for connecting to RF power amplifiers 102.

The plurality of transmit coil elements 101 of the present invention may be resonant or non-resonant conductors or small coils, and they are small-sized active coil elements. The transmit coil elements 101 of the present invention can have flexible structure and can be used to compose various geometric coil structures. The plurality of transmit coil elements 101 of the present invention may be arranged in any matrix coil arrays in x, y and/or z axis.

Figure 3:
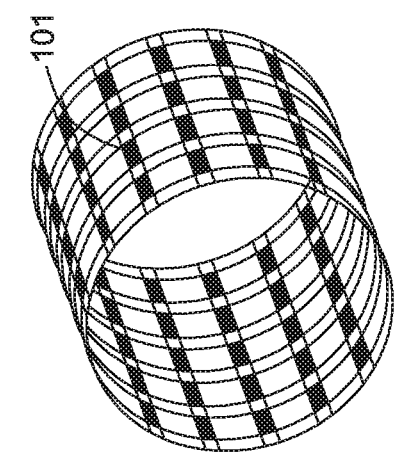
FIGS. 3-5 illustrate different geometric structures of RF coil array in accordance with embodiments of the present invention.
Figure 4:
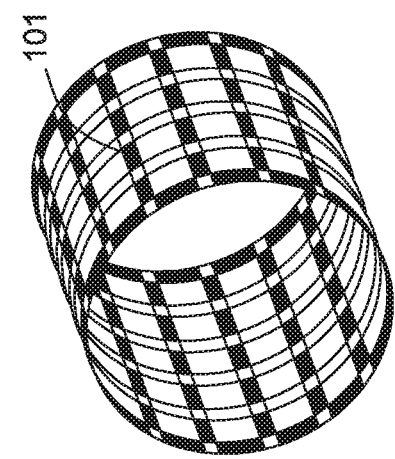
Figure 5:
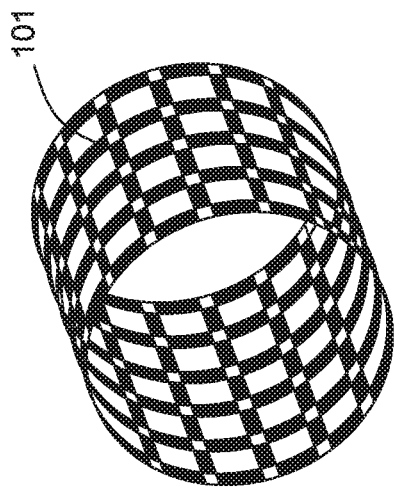

In one embodiment of the RF coil array 100, the plurality of transmit coil elements 101 may be configured to a volume body coil. As shown in FIG. 3, the plurality of transmit coil elements 101 may be configured to be a stripline coil. As shown in FIG. 4, the plurality of transmit coil elements 101 may be configured to be a birdcage coil. As shown in FIG. 5, the plurality of transmit coil elements 101 may be configured to be a new lattice coil. Certainly, the coil structures shown in FIGS. 3-5 are only as some illustrative examples of the present invention, but are not intended to limit the present invention. As a matter of fact, the plurality of transmit coil elements 101 of the present invention can be configured to any other useful structure.

In another embodiment of the RF coil array 100, the plurality of transmit coil elements 101 may be configured to a local surface coil. Such a local surface coil may be placed closer to a patient. Thus, it may have higher RF efficiency with lower RF power required and may simplify the system. In addition, the local surface coil may enable increased bore space to accommodate the patient and increase patient comfortability by obviating the need for a large volume cylindrical transmit/receive coil.

The plurality of transmit coil elements 101 may be flexibly arranged in x, y and/or z axis, and many low-power RF power amplifiers 102 are integrated with respective transmit coil elements 101, which opens up a new multi-channel coil architecture. The amplitudes and phases of the low-power RF power amplifiers 102 can be independently controlled in such new multi-channel coil architecture to provide higher degrees of freedom to manipulate the $B_1$ excitation magnetic field. In some embodiments, the high transmit channel count can also aid in spatial localization of MR signals in conjunction with a suitably designed coil array. The integrated RF power amplifier with multi-channel coil architecture may also significantly reduce cable losses and RF transmit infrastructure footprint. The ability to utilize the high transmit channel count and independent transmit coil elements enable different applications and system concepts as compared to a traditional, large-volume excitation MRI transmit coil. By utilizing a large array of small independent transmit coil elements 101, spatially selective excitation can be better controlled and localized to a region of a patient's body. For a spatially selective excitation, only transmit coil elements 101 that contribute to generate the $B_1$ excitation field in region-of-interest (ROI) regions of the patient's body will be energized, which may limit the SAR (Specific Absorption Rate) exposure to other parts of the patient's body and reduce average SAR exposure of the whole body during the MRI. The increased degrees of freedom afforded by the transmit coil elements 101 also enable better control of $B_1$ homogeneity and the $B_1$ homogeneity can be optimized in conjunction with suitable SAR constraints. With each transmit coil element 101 precisely controlled, local power dissipation in the patient can be more precisely estimated, thereby improving performance and utilization of overall system.

As an example, the RF coil array 100 of the present invention has N transmit coil elements 101, so N channels are formed in the RF coil array 100 of the present invention. A total $B_1$-field generated by the RF coil array 100 can be formed by a complex weighted sum of the $B_1$-field generated from each transmit coil element or channel as shown in the following equation:

$$B_1^{arr}(x,y,z) = \Sigma_{i=1}^N A_i e^{-2\pi j \Phi_i} b_i(x,y,z) \quad (4)$$

where $j=\sqrt{-1}$. In equation (4) above, $B_1^{arr}(x, y, z)$ represents the total $B_1$-field generated by the RF coil array 100, N represents the number of transmit coil elements or channels, $b_i(x, y, z)$ describes the spatially-varying $B_1$-field sensitivity profile generated by the $i^{th}$ transmit coil element, $A_i$ and $\emptyset_i$ are the real-valued amplitude and phase weights respectively applied to the $i^{th}$ transmit coil element. Equation (4) represents a special case where the amplitude and phase weights are time-independent. This means that the time-varying RF waveform applied to each transmit coil element is identical. This special case is also referred to as RF shimming. The amplitude and phase terms can be easily represented by a set of complex-valued weights such that $$B_1^{arr}(x,y,z) = \Sigma_{i=1}^N w_i b^i(x,y,z) \quad (5)$$

where $w_i = A_i e^{-2\pi j \Phi_i}$.

Hence, for a desired target transmit (excitation) $B_1$ field, $B_1^{tar}(x, y, z)$, the amplitude and phase applied to each transmit coil element or the set of complex-valued weights, $\{w_i\}$, can be determined by minimizing the matrix-vector form of a cost function to obtain the following:

$$\hat{w} = \underset{w}{\arg\min} |B_1^{tar} - B_1^{arr}|^2 + R(w) \quad (6)$$

such that $\hat{w}$ yields a combined $B_1$ map that minimizes the cost function in equation (6). $B_1^{tar} = \hat{B}_1^{tar}(x, y, z) = \Sigma_{i=1}^N \hat{w}_i b_i(x, y, z)$ then represents the nearest approximation of the desired target field achieved by the solution, $\{w_i\}$, to equation (6). $R(w)$ is a generalized regularization term that is a function of the complex-valued weights, $w = \{w_i\}$, that we are hoping to determine and optimize. This is an approach that is frequently used when a solution to an ill-posed problem is sought through fitting. An example of a regularization term is when $$R(w) = \alpha \|w\|^2 \quad (7)$$

where $\alpha$ is a scalar and $\|w\|$ is the $L_2$-norm of the set of complex-valued weights, $\{w_i\}$, of the individual transmit coil elements or channels. Equation (7) is a common form of regularization known as Tikhonov regularization. The selection of the value of $\alpha$ is determined by the level of ill-conditioning of the system matrix in equation (6). $|B_1^{tar}(x,$ y, z)−$B_1^{arr}$(x, y, z)|$^2$ is the data consistency term and is simply a measure of how well the set of coefficients or complex-valued weights, $\{w_i\}$, in equation (4) reproduces the target field.

A more generalized case for controlling the RF excitation or $B_1$-field includes not only varying the amplitude and phase, $A_i$ and $\phi_i$, for each transmit coil element or channel but also the time-varying RF waveform, $f_i(t)$, for each transmit coil element. This approach is known as parallel transmit (or parallel excitation) with RF pulse design and is discussed in Grissom, et al (*Magn Med Med* 2006; 56: 620-9, Spatial domain method for the design of RF pulses in multi-coil parallel excitation). Rather than just controlling the shape of the RF excitation of $B_1$-field, this approach can also control the spatial extent of RF excitation, allowing more complex patterns of RF excitation by utilizing spatially selective RF pulses individualized for each transmit coil element or channel in addition to the complex-valued weighting of each transmit coil element or channel.

By being able to include different time-varying RF waveforms into the optimization, the relevant measure for parallel transmit or excitation, is the spatially-tailored transverse magnetization, m(x, y, z) resulting from the application of the RF excitation or $B_1$-field and the accompanying and concurrent gradient field. Note that by applying an RF excitation waveform concurrently with a gradient field, the RF excitation can be spatially selective for the $i^{th}$ transmit coil element or channel. Hence, an overall tailored excitation pattern can be generated by the superposition of the excitation patterns from each transmit coil element or channel as in $$m^{arr}(x,y,z) = j\gamma m_0(x,y,z)\Sigma_{i=1}^N b_i(x,y,z)\int_0^T f_i(t)$$
$$e^{j\gamma\Delta B_0(x,y,z)(t-T)} e^{j\vec{k}\cdot\vec{k}(t)} dt \quad (8)$$

that is derived from an RF pulse design approach. Equation (8) includes the effects of phase accrual due to the static main magnetic field inhomogeneity ($e^{j\gamma\Delta B_0(x, y, z)(t-T)}$), k-space trajectory of the applied gradient waveform $\vec{k}(t) = k_x(t)\hat{i}+k_y(t)\hat{j}+k_z(t)\hat{k}$), and the equilibrium magnetization at $\vec{r}(t)=x\hat{i}+y\hat{j}+z\hat{k}$, ($m_0$(x, y, z)). $\vec{k}(t)$ is defined as the time-integration of the applied gradient waveforms, $\vec{k}(t) = -\gamma\int_t^T \vec{G}(\tau) d\tau$, where T is the pulse length of the RF waveform, $f_i(t)$, $\vec{G}(t)$ is the applied gradient waveform during RF excitation, and $\Delta B_0$(x, y, z) is the static field homogeneity map. Equation (8) can be simplified by using $$D_i(x,y,z,t_j) = j\gamma m_0(x,y,z)b_i(x,y,z)e^{j\gamma\Delta B_0(x,y,z)(t-T)} e^{j\vec{k}\cdot\vec{k}(t)} \quad (9)$$

the overall excitation pattern of equation (8) can then be written as $$m^{arr}(x,y,z) = \tau_{i=1}^N \int_0^T (x,y,z) f_i(t) dt \quad (10)$$

Hence, if the desired target excitation profile is described by the magnetization distribution of $m^{tar}$(x, y, z), then the desired complex RF waveforms applied to each transmit coil element or channel can be determined by minimizing the matrix-vector form of the cost function to obtain $$\hat{f} = \underset{f}{\arg\min}\{|m^{tar}-m^{arr}|^2 + R(f)\} \quad (11)$$

where the generalized regularization term is a function of the time varying RF pulse waveforms, $\hat{f}=\{\hat{f}_i\}$, expressed in vector form. The resultant excitation profile, $\hat{m}^{arr}$(x, y, z)=$\Sigma_{i=1}^N \int_0^T D_i$(x, y, z) $\hat{f}_i$(t) dt, reproduces the nearest approximation of the target field that can be achieved by the solution set, $\hat{f}=\{\hat{f}_i\}$, where the $i^{th}$ channel RF waveform in the set is applied to the respective $i^{th}$ transmit coil element or channel. As in equation (7), an example of a generalized regularization term then can be used in equation (11) is Tikhonov regularization $$R(f) = \alpha\|f\|^2 \quad (12)$$

where $\|f\|$ is the $L_2$-norm of the time-varying RF waveforms of the individual transmit coil elements.

Equations (6) and (11) can be solved numerically to compute the solution sets of the weights and RF waveforms of each transmit coil element that yield the desired $B_1$-field distribution or tailored excitation profile.

Figure 6:
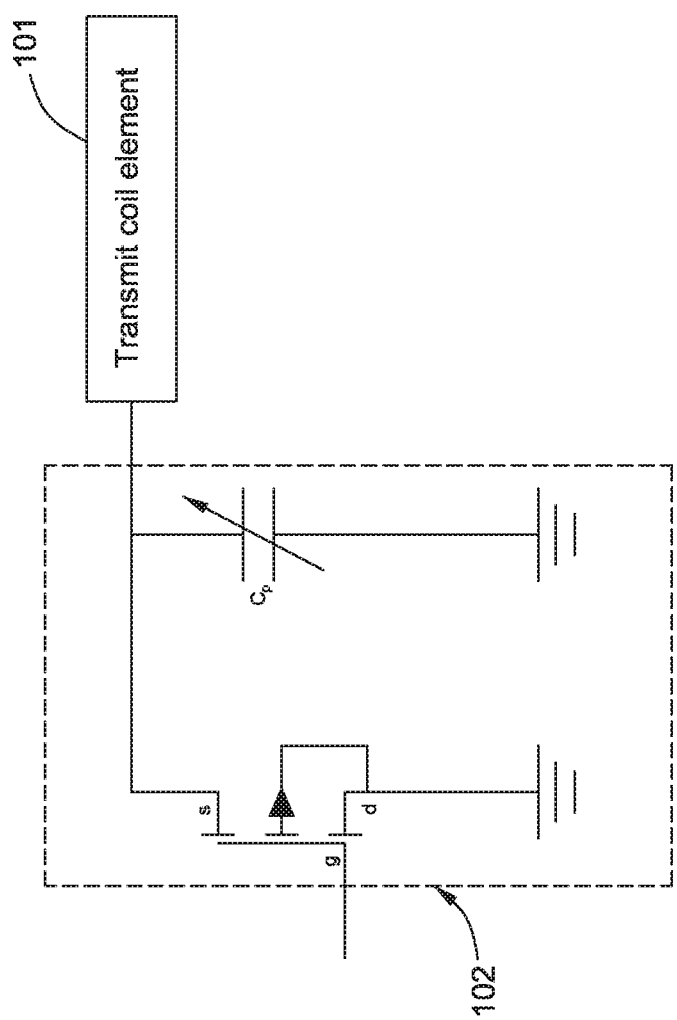
FIG. 6 is a schematic diagram of an RF coil array in accordance with another embodiment of the present invention.

In an optional embodiment, referring to FIG. 6, each RF power amplifier 102 of the present invention may further include a variable capacitor $C_p$. The variable capacitor $C_p$ may be connected in parallel with the MOSFET 102. The variable capacitor $C_p$ may be implement by using a varicap or parasite capacitors in the MOSFET 102. A capacitance value of the variable capacitor $C_p$ may depend on a length of the section of radiation conductor 101 with which the MOSFET 102 is integrated or coupling from other transmit coil elements 101 or load. The variable capacitor $C_p$ is used to achieve higher efficiency for the MOSFETs 102 connecting to the respective transmit coil elements 101.

Figure 7:
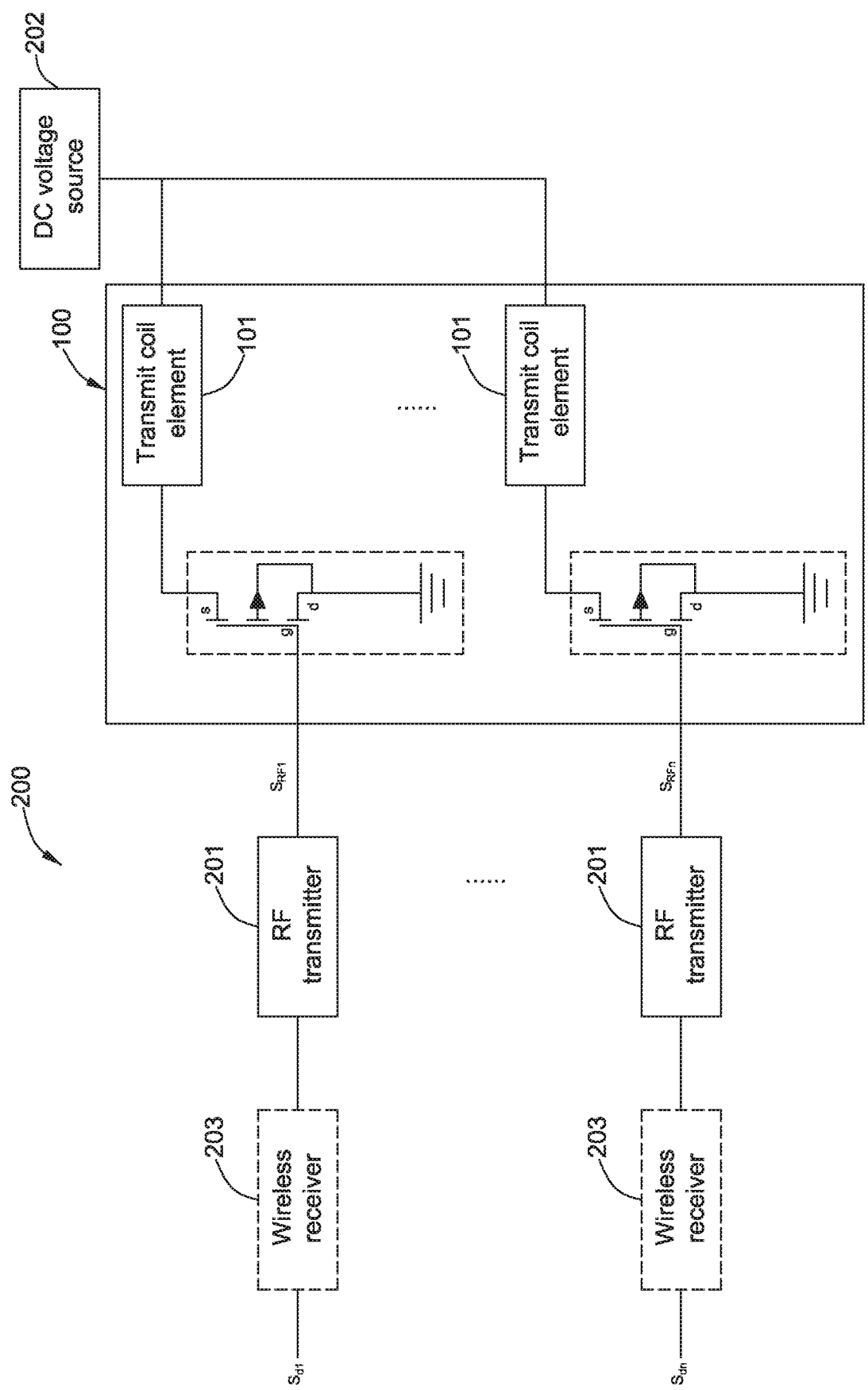
FIG. 7 is a block diagram of an MRI transmit array in accordance with an embodiment of the present invention.

FIG. 7 illustrates a block diagram of an MRI transmit array 200 in accordance with an embodiment of the present invention. With reference to FIG. 7, the MRI transmit array 200 in accordance with an embodiment of the present invention may include a plurality of RF transmitters 201, the above-mentioned RF coil array 100 including a plurality of transmit coil elements 101 and a plurality of RF power amplifiers 102 integrated with respective transmit coil elements 101 for driving the respective transmit coil elements 101, and a DC (Direct Current) voltage source 202 for providing a DC voltage $DC_{IN}$ to the plurality of transmit coil elements 101.

The plurality of RF transmitters 201 may generate a plurality of RF signals $S_{RF1}$-$S_{RFn}$. The plurality of RF power amplifiers 102 may be connected with respective RF transmitters 201 and may power amplify the RF signals $S_{RF1}$-$S_{RFn}$ from the respective RF transmitters 201. The plurality of transmit coil elements 101 may transmit respective amplified RF signals. The MRI transmit array 200 of the present invention may provide a multi-channel parallel transmit.

In some embodiments, at least one portion of the plurality of transmit coil elements 101 may be selectively excited by respective RF transmitters 201 so as to achieve spatially selective excitation and spatial localization of RF signals.

Figure 8:
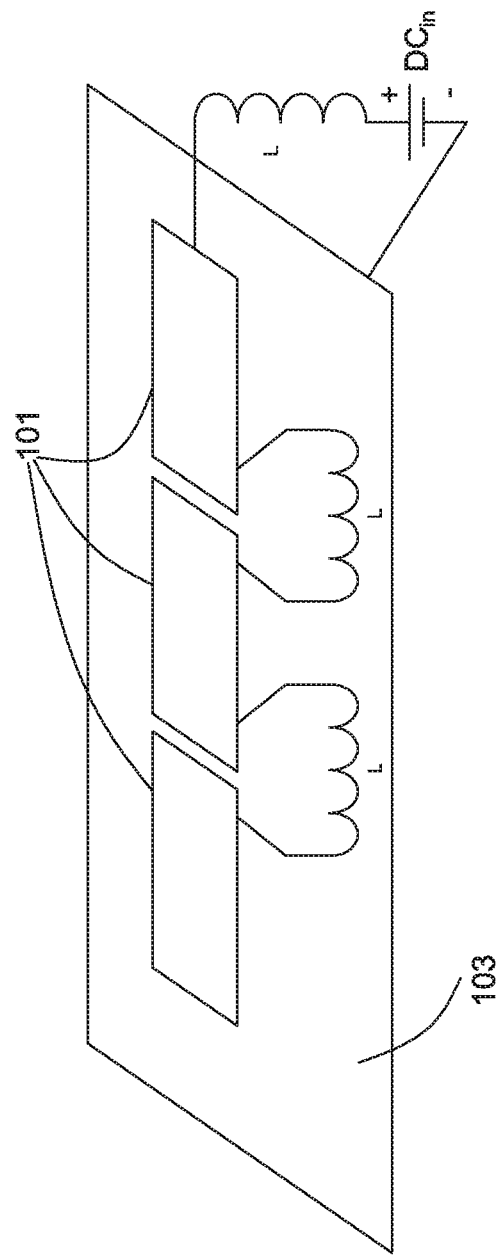
FIG. 8 illustrates a DC power connection of transmit coil elements in the MRI transmit array in accordance with an embodiment of the present invention.

FIG. 8 illustrates a DC power connection of the transmit coil elements 101 in the MRI transmit array 200 in accordance with an embodiment of the present invention. As shown in FIG. 8, every two adjacent transmit coil elements 101 may be connected via an RF choke L. The RF choke L may be for example a choke inductor L. The plurality of transmit coil elements 101 are connected to the RF shield 103 via the DC voltage source 202, and thus, the DC voltage source 202 may provide the DC voltage $DC_{IN}$ to the plurality of transmit coil elements 101. The RF choke L may allow a direct current (DC) to pass and block an alternating current (AC).

Figure 9:
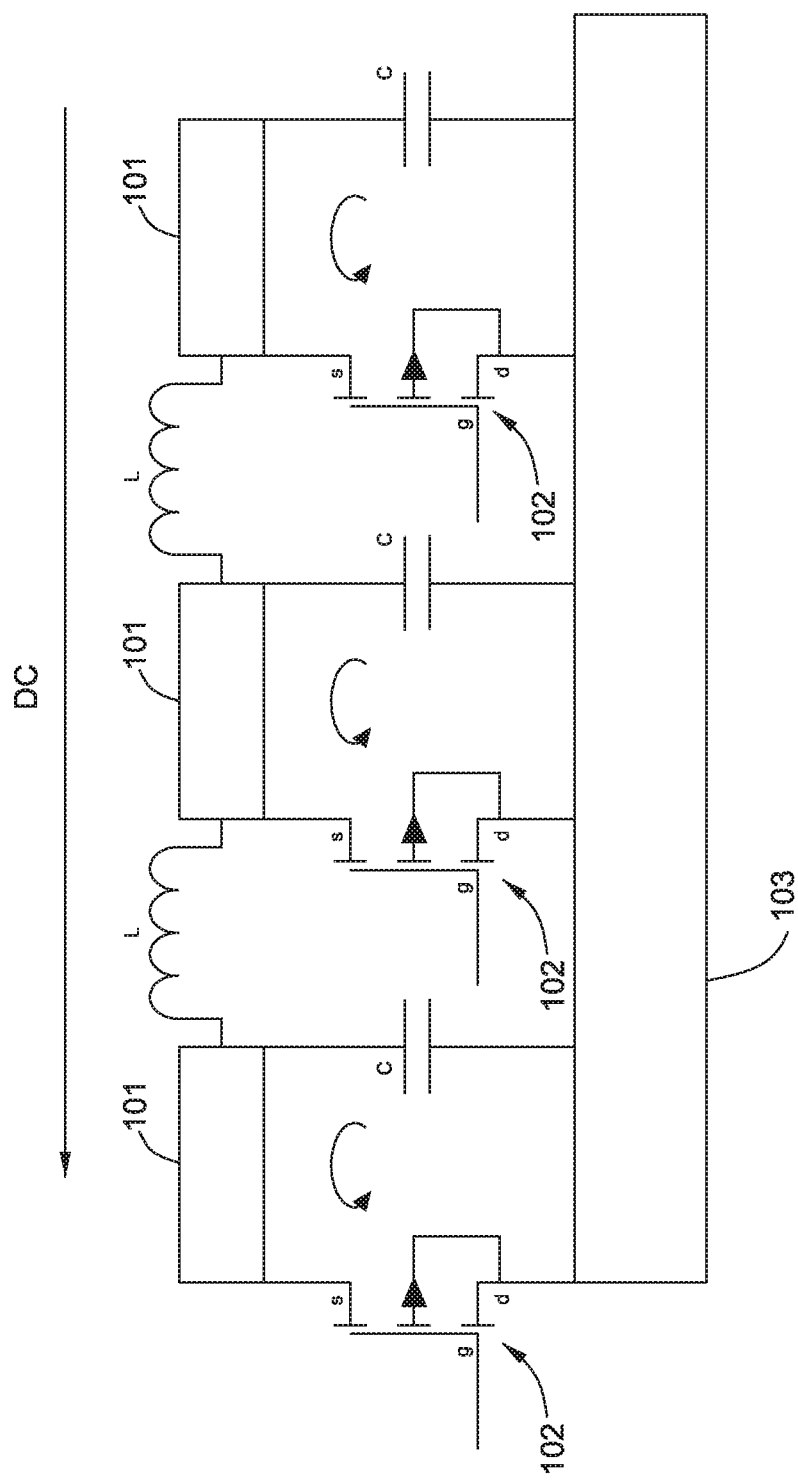
FIG. 9 illustrates an equivalent circuit of a DC bias configuration for the transmit coil elements of FIG. 8.

FIG. 9 illustrates an equivalent circuit of a DC bias configuration for transmit coil elements 101 of FIG. 8. As shown in FIG. 9 in combination with FIG. 8, each transmit coil element 101 may be electrically connected to the RF shield 103 via a capacitor C. In the embodiment that the RF power amplifier 102 is the MOSFET, a source electrode s of each MOSFET 102 may be directly connected onto a first end of one transmit coil element 101, and a drain electrode d of the MOSFET may be connected to the RF shield 103. A second end of the transmit coil element 101 may be connected to the RF shield 103 via the capacitor C.

In FIGS. 8 and 9, the DC voltage $DC_{IN}$ supplied by the DC voltage source 202 may be propagated to all the transmit coil elements 101 while the time-varying RF signals between the transmit coil elements 101 may be blocked by the RF chokes L and shorted to ground by the capacitors C at the second end of each transmit coil element 101.

The plurality of transmit coil elements 101 and the RF shield 103 can serve as heat sinks for thermal management, and electrical paths to bias and drive the MOSFETS 102. The MRI transmit array 200 of the present invention may allow some degree of higher-order $B_0$ shimming to improve $B_0$ magnetic field homogeneity.

Figure 10:
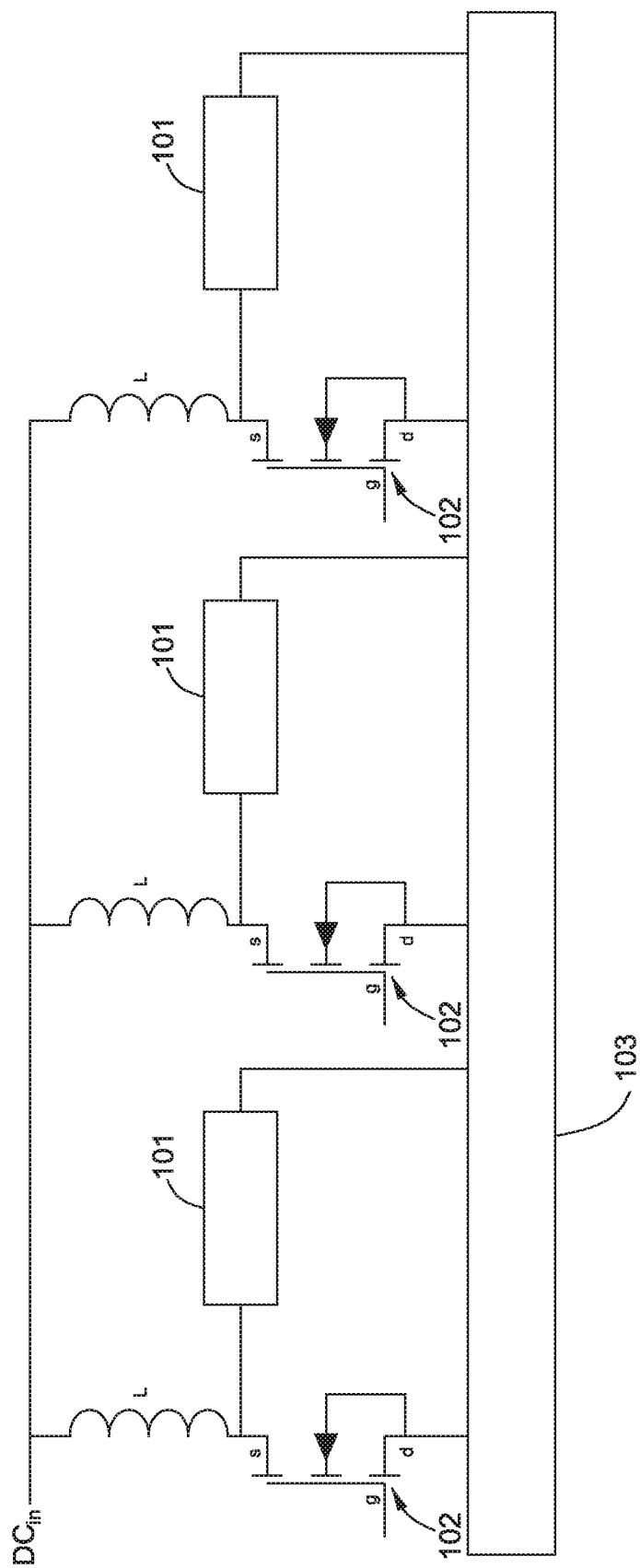
FIG. 10 illustrates a DC power connection of transmit coil elements in the MRI transmit array in accordance with another embodiment of the present invention.

FIG. 10 illustrates a DC power connection of the transmit coil elements 101 in the MRI transmit array 200 in accordance with another embodiment of the present invention. As shown FIG. 10, each transmit coil element 101 may be connected to the DC voltage source 202 via an RF choke L, for example a choke inductor, and thus, the DC voltage source 202 may provide the DC voltage $DC_{IN}$ to the plurality of transmit coil elements 101. Each transmit coil element 101 may be directly and electrically connected to the RF shield 103. In the embodiment that the RF power amplifier 102 is the MOSFET, a source electrode s of each MOSFET 102 may be directly connected onto a first end of one transmit coil element 101, and a drain electrode d of the MOSFET 102 may be connected to the RF shield 103.

In FIG. 10, similarly, the DC voltage $DC_{IN}$ supplied by the DC voltage source 202 may be propagated to all the transmit coil elements 101 while the time-varying RF signals between the transmit coil elements 101 may be blocked by the RF chokes L and shorted directly to ground at a second end of each transmit coil element 101.

Returning to FIG. 7, optionally, the MRI transmit array 200 of the present invention may further include a plurality of wireless receivers 203. The plurality of wireless receivers 203 may receive a plurality of wireless digital signals $S_{d1}$-$S_{dn}$ from an upper computer (not shown) and transferring the plurality of wireless digital signals $S_{d1}$-$S_{dn}$ to the respective RF transmitters 201. Thus, transmission and control of wireless digital signals could be realized, which may provide the opportunity to additional system simplification and improve the SNR (Signal Noise Ratio) of input signals. Each integrated RF power amplifier 102 as well as each wireless receiver 203 may be packaged together as one single component.

Adopting the RF coil array 100 of the present invention may increase the capability to manipulate the RF transmit ($B_1$ field) and the SAR distributions such that higher quality images may be obtained with better management of patient local and average SAR. The RF coil array 100 of the present invention is more power-efficient with lower levels of cable losses, may reduce RF power amplifier 102 equipment footprint and may thus reduce product cost.

In addition, The RF coil array 100 of the present invention may improve the spatial localization of MR signals by allowing more effective $B_1$ field shaping.

Furthermore, the increase of transmit coil element channel count does not increase complexity with the RF power amplifiers 102 integrated with the respective transmit coil elements 101.

While the invention has been illustrated and described in typical embodiments, it is not intended to be limited to the details shown, since various modifications and substitutions can be made without departing in any way from the spirit of the present invention. As such, further modifications and equivalents of the invention herein disclosed may occur to persons skilled in the art using no more than routine experimentation, and all such modifications and equivalents are believed to be within the spirit and scope of the invention as defined by the following claims.

What is claimed is:

1. An RF coil array for use in MRI, comprising:
an RF shield;
a plurality of transmit coil elements mounted on the RF shield; and
a plurality of RF power amplifiers, wherein each RF power amplifier is mounted directly on at least one transmit coil element for driving the at least one transmit coil element; and
a DC voltage source for providing a DC voltage to the plurality of transmit coil elements, wherein the plurality of transmit coil elements are connected to the RF shield via the DC voltage source.

2. The RF coil array of claim 1, wherein the plurality of transmit coil elements are non-resonant.

3. The RF coil array of claim 1, wherein each of the plurality of RF power amplifiers has the behavior of a voltage source or a current source.

4. The RF coil array of claim 1, wherein the transmit coil element is a small coil, wherein each transmit coil element of the plurality of transmit coil elements is substantially small in relation to the RF coil array.

5. The RF coil array of claim 1, wherein each RF power amplifier comprises a MOSFET.

6. The RF coil array of claim 5, wherein each RF power amplifier comprises a packaged discrete MOSFET, or a semiconductor MOSFET die which is directly attached to one transmit coil element.

7. The RF coil array of claim 5, wherein each RF power amplifier further comprises:
a variable capacitor connected in parallel with the MOSFET.

8. The RF coil array of claim 1, wherein the plurality of transmit coil elements are arranged in matrix coil arrays in x, y and/or z axis.

9. The RF coil array of claim 8, wherein the plurality of transmit coil elements are configured to a volume body coil or a local surface coil.

10. An Mill transmit array comprising:
a plurality of RF transmitters for generating a plurality of RF signals;
an RF coil array comprising:
a plurality of transmit coil elements;
an RF shield for shielding the plurality of transmit coil elements from interacting with magnet cryostat and gradient coil elements; and
a plurality of RF power amplifiers each mounted directly on at least one transmit coil element for driving the at least one transmit coil element,
wherein the plurality of RF power amplifiers are connected with respective RF transmitters and configured for power amplification of the RF signals from the respective RF transmitters, and the plurality of transmit coil elements are configured for transmitting respective amplified RF signals so as to provide a multi-channel parallel transmit; and
a DC voltage source for providing a DC voltage to the plurality of transmit coil elements, wherein the plurality of transmit coil elements are connected to the RF shield via the DC voltage source.

11. The MRI transmit array of claim 10, wherein every two adjacent transmit coil elements are connected via an RF choke, and each transmit coil element is electrically connected to the RF shield via a capacitor.

12. The MRI transmit array of claim 10, wherein each transmit coil element is connected to the DC voltage source via an RF choke, and each transmit coil element is electrically connected to the RF shield.

13. The MRI transmit array of claim 10, wherein at least one portion of the plurality of transmit coil elements are selectively excited by respective RF transmitters.

14. The MRI transmit array of claim 10, further comprising:
   a plurality of wireless receivers for receiving a plurality of wireless digital signals from an upper computer and transferring the plurality of wireless digital signals to the respective RF transmitters.

15. The MRI transmit array of claim 10, wherein the plurality of transmit coil elements are non-resonant.

16. The MRI transmit array of claim 10, wherein the transmit coil element is a small coil, wherein each transmit coil element of the plurality of transmit coil elements is substantially small in relation to the RF coil array.

17. The MRI transmit array of claim 10, wherein the plurality of transmit coil elements are configured to a volume body coil or a local surface coil.

18. The MRI transmit array of claim 10, wherein the plurality of transmit coil elements integrated with respective RF power amplifiers are mounted onto the RF shield.

19. The MRI transmit array of claim 10, wherein each RF power amplifier comprises a packaged discrete MOSFET, or a semiconductor MOSFET die which is directly attached to one transmit coil element.

* * * * *